United States Patent
Yang et al.

(10) Patent No.: US 6,627,475 B1
(45) Date of Patent: Sep. 30, 2003

(54) BURIED PHOTODIODE STRUCTURE FOR CMOS IMAGE SENSOR

(75) Inventors: Hua Yu Yang, Hsin-chu (TW); Ching-Wen Cho, Chu-San (TW); Chih-Heng Shen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/483,034

(22) Filed: Jan. 18, 2000

(51) Int. Cl.⁷ .............................................. H01L 21/00
(52) U.S. Cl. ........................... 438/57; 438/73; 438/199
(58) Field of Search ............................ 438/57, 73, 199

(56) References Cited

U.S. PATENT DOCUMENTS

| | | | |
|---|---|---|---|
| 5,679,597 A | 10/1997 | Moon | 437/53 |
| 5,828,091 A | 10/1998 | Kawai | 257/218 |
| 5,841,159 A * | 11/1998 | Lee et al. | 257/191 |
| 5,859,450 A | 1/1999 | Clark et al. | 257/233 |
| 5,904,493 A * | 5/1999 | Lee et al. | 438/57 |
| 6,027,955 A * | 2/2000 | Lee et al. | 438/57 |
| 6,040,592 A * | 3/2000 | McDaniel et al. | 257/292 |
| 6,084,259 A * | 7/2000 | Kwon et al. | 257/292 |
| 6,100,551 A * | 8/2000 | Lee et al. | 257/232 |

\* cited by examiner

*Primary Examiner*—Long Pham
(74) *Attorney, Agent, or Firm*—George O. Saile; Stephen B. Ackerman

(57) ABSTRACT

A method of forming an image sensor is disclosed. A partially processed semiconductor wafer is provided, containing a p-type region. An n-type photodiode region is formed within the p-type region. A field oxide isolation region is then formed which extends beyond the p-type region and also covers the p-type region except for an active region and an overlap part of the n-type photodiode region. An n-channel MOSFET is fabricated in the active region with one of the source/drain regions of the MOSFET extending over the overlap part of the n-type photodiode region. A blanket transparent insulating layer is then deposited.

34 Claims, 1 Drawing Sheet

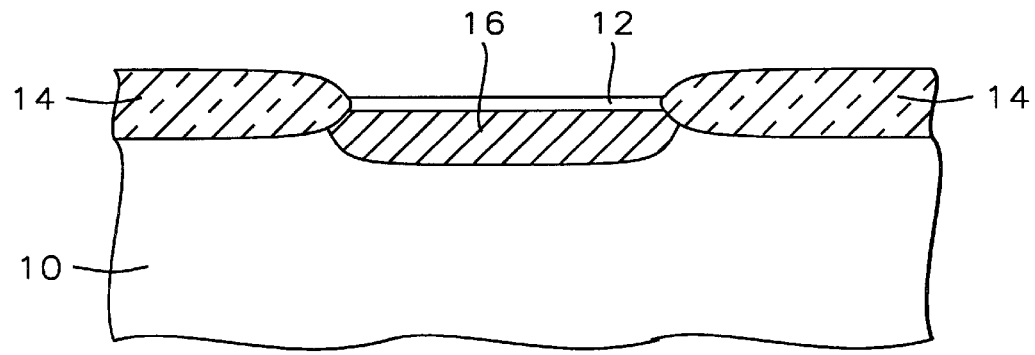
*FIG. 1 - Prior Art*
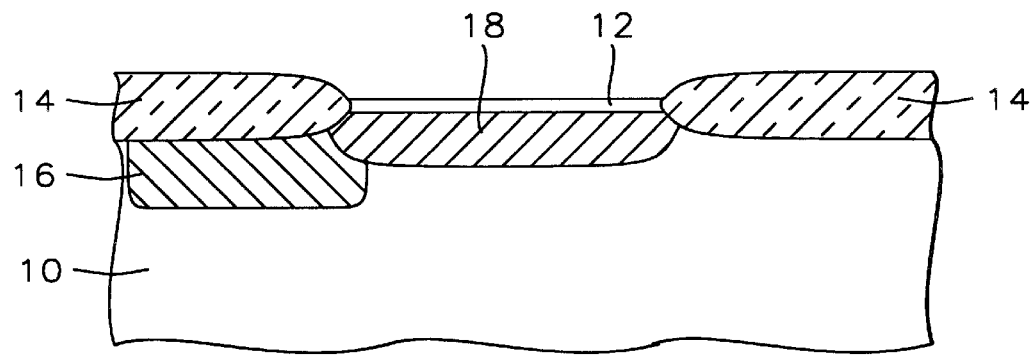
*FIG. 2*

BURIED PHOTODIODE STRUCTURE FOR CMOS IMAGE SENSOR

BACKGROUND OF THE INVENTION (1) Field of the Invention

The present invention relates generally to image sensing devices and more particularly to image sensing devices built using CMOS fabricating processes.

(2) Description of Prior Art

State of the art CMOS image sensors often use junction photodiodes as light detection devices. Photons creating charge carriers within an effective region, about the p-n junction of the photodiode, give rise to current and can thus be detected. The effective region essentially consists of the depletion region and the regions that are within a minority carrier diffusion length of the depletion region on either side of the junction. However, charge carriers are also generated thermally and those generated within the effective region give rise to current even in the absence of light. To optimize the photodiode sensitivity it is necessary to minimize this dark current, which can be accomplished, by minimizing the thermal charge carrier generation rate. Imperfections and impurities give rise to increased thermal generation rates and these are more prevalent in the vicinity of surfaces and interfaces. This is because defects can arise from stresses found near surfaces and interfaces and also from process steps, such as ion implantation, that causes damage near the surface, and interfaces and impurities can be introduced through surfaces during processing. Stress induced dark currents are particularly enhanced near corners and edges where the stress is enhanced.

A cross-section of a conventional photodiode is shown in FIG. 1 Prior Art. A p-type region, 10, is provided, which could be a p-well formed in an n-type semiconductor substrate. A field oxide, 14, is grown, delineating an active area to contain the photodiode and n-channel FET of an image sensor and providing electrical isolation. A gate oxide, 12, is then grown over the active area. Next the n-channel FET, which often has an LLD (lightly doped drain) structure, and the photodiode are formed. A polysilicon gate is formed (parallel to the cross-section of FIG. 1 Prior Art) dividing the available area into a smaller part that will contain a source/drain region and a larger part to contain a source/drain region and a photodiode. After a shallower, lower dose implant forming n-regions, in both parts, self-aligned to the polysilicon gate electrode, oxide spacers are formed on the gate electrode. A deeper, higher dose implant is self-aligned to the oxide spacers to form n+-regions, in both parts, below, but abutting, the n-regions. Region 16 of FIG. 1 Prior Art represents this double implant for the photodiode. Finally a transparent insulating layer, such as BPTEOS, is deposited to passivate the structure.

Conventional photodiodes, such as depicted in FIG. 1 Prior Art, can be affected by imperfections near the surface which give rise to excessive dark current. Defects resulting from the ion implantation steps are not removed in subsequent processing steps, because after the source/drain regions are formed temperatures are kept low. The vicinity of the edge of the field oxide regions is especially susceptible to stress induced imperfections. If the photodiode depletion region intersects the vicinity of the field oxide edge, as it does for the conventional diode of FIG. 1 Prior Art, then excessive dark current can result.

U.S. Pat. No. 5,859,450 to Clark et al. shows a photodiode under a shallow trench insulating region. A guard ring is included to reduce dark current. However, serious stress can exist in the vicinity of corners of the shallow trench insulation regions that are intersected by the photodiode depletion region. This will induce excessive dark current. Moon in U.S. Pat. No. 5,679,597 discloses a method for forming a CCD having a photodiode on the substrate surface. U.S. Pat. No. 5,828,091 to Kawai discloses a CCD including a photodiode.

SUMMARY OF THE INVENTION

Accordingly, it is a primary objective of the invention to provide a method of forming an inherently low dark current photodiode appropriate for CMOS image sensors. Performing the photodiode implant early in the process; before oxidation, polysilicon gate forming, and source/drain implant steps; allows for annealing of defects introduced by the photodiode implantation. Placing the photodiode substantially under the field oxide is also to be preferred. Thermal oxidation introduces relatively low stress in the silicon. Overlapping the photodiode implant region with the n+ source/drain region removes the photodiode depletion region from high stress corners at the field oxide edge.

A method of forming a low dark current photodiode is disclosed. In a preferred embodiment of the invention, a semiconductor substrate containing a p-type region is provided. For example, the p-type region can be a p-well in an n-type substrate, or it can be a p-type substrate. An n-type region is formed in the p-type region. Now, a field oxide is grown over the p-type region except for an active region, where a p-channel transistor is to be constructed, and extending beyond the boundaries of the p-type region. The field oxide substantially covers the n-type region except that on one side, the periphery of the n-type region extends somewhat beyond the edge of the field oxide. Next a gate oxide layer is grown over the surface of the active region. Construction of an n-channel FET, in the active region, follows. One of the source/drain regions of the FET overlaps that part of the n-type region that extends beyond the field oxide and also somewhat under the field oxide, A transparent insulating layer, such as BPTEOS, is now deposited. Interchanging n-type and p-type regions in this description and using a p-channel FET provides other embodiments of the invention.

A method of forming an image sensor is disclosed. A partially processed semiconductor wafer is provided, containing a p-type region. An n-type photodiode region is formed within the p-type region. A field oxide isolation region is then formed which extends beyond the p-type region and also covers the p-type region except for an active region and an overlap part of the n-type photodiode region. An n-channel MOSFET is fabricated in the active region with one of the source/drain regions of the MOSFET extending over the overlap part of the n-type photodiode region. A blanket transparent insulating layer is then deposited.

BRIEF DESCRIPTION OF THE DRAWINGS

In the accompanying drawings, forming a material part of this description, there is shown:

FIG. 1 Prior Art shows the layout of a conventional photodiode in a CMOS image sensor.

FIG. 2 shows the layout of a photodiode in a CMOS image sensor according to a preferred embodiment of this invention.

DESCRIPTION OF THE PREFERRED EMBODIMENTS

FIG. 2 illustrates a cross-sectional view through a photodiode formed according to a preferred embodiment of the invention. Referring to FIG. 2, region 10 is a p-type region, which in preferred embodiments of the invention is a p-well or a p-type semiconductor substrate. Methods of forming a p-well are well known to those versed in the art. Prior to the growth of the field oxide, regional 4, region 10 is flat and would appear horizontal in FIG. 2. After the field oxide is grown, a gate oxide is grown over an active region, which will contain a photodiode and n-channel FET. Donor ions are now implanted to form the n-type region, 16, of the photodiode. In preferred embodiments of the invention, phosphorus ions are implanted to a dose of between about 1E13 to about 5E15 per cm2 using energies between about 40 to 120 keV. The photodiode implant region, 16, is situated so that it will be substantially covered by the field oxide. It extends somewhat beyond the field oxide so that it will overlap a source/drain region, 18. The extent of the overlap is between about 0.54 to 0.66 micrometers. The dimensions of the photodiode surface area is about 3.5 micrometers by 4.3 micrometers. Performing the photodiode implant at such an early stage of the process is an important part of the invention. This allows for extensive annealing of imperfections, such as defects arising from the ion implantation, during subsequent processing steps; particularly during high temperature oxide growing steps.

In preferred embodiments of the invention the isolation region, 14, should be thermally grown oxide which introduces a minimum of stress in the underlying semiconductor. This means fewer imperfections and thus lower dark current. The localized oxidation isolation, LOCOS, method, and variations such as poly-buffered LOCOS, are used extensively in integrated circuit technology and limit the stress transmitted to the semiconductor. In LOCOS, a 20 to 60 nm pad oxide layer is first formed over the surface. A 100 to 200 nm silicon nitride layer is then formed. Both the pad oxide layer and silicon nitride layers are then removed, except for an active region containing the gate and source/drain regions of the image sensor FET. The remaining silicon nitride layer functions as an oxidation mask, preventing oxidation of the active region. The underlying pad oxide layer reduces the stress that would exist if the silicon nitride layer were deposited directly on the semiconductor. Typically, the field oxide region, 14, is grown to a thickness of 500 to 900 nm by wet oxidation at temperatures of 900 to 1000 degree (C.) for 4 to 8 hours. This long high temperature oxidation step is most effective in annealing imperfection arising from the photodiode implant. Additional details concerning LOCOS and other methods of forming thermal oxide isolation structures are well known to those skilled in the art.

Next the remaining silicon nitride and pad oxide are removed and, after cleaning the surface, a gate oxide, 12, is grown over the active region. Techniques for forming gate oxides are well known to those skilled in the art. Modern FETs are often fabricated in an LLD (lightly doped drain) structure, whose procedures are well known to those skilled in the art. To achieve the LLD structure for the image sensor FET, a polysilicon or polycide gate electrode is formed about 0.35 to 1.0 micrometers wide and about 0.13 to 0.4 micrometers high. The first of the LLD source/drain implants is then performed self-aligned to the gate electrode, resulting in a shallow lightly doped region. This is normally a phosphorus implant with a dose of about 1E13 to 1E14 per cm2 and energy of about 40 to 70 keV. Insulating spacers, often composed of TEOS, are formed on the sides of the gate electrode whose width is about 75% to about 85% of the gate electrode height. The second of the LLD source/drain implants is then performed self aligned to the spacers, resulting in a deeper n+ region overlapping, but mainly below the first LLD source/drain implant. Typically the second LLD source/drain implant is arsenic with a dose of about 1E15 to 5E15 per cm2 and energy of about 35 to 65 keV. The region formed by both the first and second LLD implant is region 18 in FIG. 2. It is important that region 18 overlap the photodiode implant region, 16, for electrical continuity, and in the vicinity of the field oxide edge, to insure that the photodiode depletion region is removed from the field oxide edge. This is especially important since such edges are prone to contain an abundance of imperfections. Next a transparent insulating layer is deposited which preferably can be BPTEOS, LPTEOS or PEoxide.

In other embodiments of the invention the photodiode could be formed by an acceptor implant into an n-type region and with a p-channel FET.

While the invention has been particularly shown and described with reference to the preferred embodiments thereof, it will be understood by those skilled in the art that various changes in form and detail may be made without departing from the spirit and scope of the invention.

What is claimed is:

1. A method of forming an image sensor comprising:
   providing a partially processed semiconductor wafer containing a p-type region;
   forming an n-type photodiode region within said p-type region, where said n-type photodiode region is formed singly, separately, independently and before the formation of isolation, gate, and source/drain regions;
   forming a field oxide isolation region which extends beyond said p-type region and covers said p-type region except for an active region and an overlap part of said n-type photodiode region, which will overlap a source/drain region of an n-channel MOSFET;
   forming an n-channel MOSFET in said active region, said n-channel MOSFET containing a gate electrode, a gate oxide layer and source/drain regions, with one of the source/drain regions of said MOSFET extending over said overlap part of said n-type photodiode region;
   depositing a blanket transparent insulating layer.

2. The method of claim 1 wherein said p-type region is a p-well or a p-type substrate.

3. The method of claim 1 wherein said n-type photodiode region is formed by ion implantation of donor ions.

4. The method of claim 1 wherein the dimensions of the surface area of said n-type photodiode region is about 3.5 micrometers by 4.3 micrometers.

5. The method of claim 1 wherein said n-type photodiode region is formed by implantation of phosphorous or arsenic ions.

6. The method of claim 1 wherein said n-type photodiode region is formed by implantation of phosphorus to a dose of about 1E13 to about 5E15 per cm2 and an energy of about 40 to about 120 keV.

7. The method of claim 1 wherein said field oxide isolation region is formed by thermal oxidation.

8. The method of claim 1 wherein said field oxide isolation region is formed using the LOCOS process or the poly-buffered LOCOS process.

9. The method of claim 1 wherein the field oxide of said field oxide isolation region is grown to a thickness of about 500 to about 900 nm at a temperature of between about 900 to about 1000 degrees (C.).

10. The method of claim 1 wherein the gate electrode of said MOSFET is composed of polysilicon or polycide.

11. The method of claim 1 wherein the gate electrode of said MOSFET is between about 0.35 to 1.0 micrometers wide.

12. The method of claim 1 wherein a first donor implant is self-aligned to the gate electrode of said MOSFET and could be phosphorous ions implanted to a dose of about 1E13 to 1E14 at energy of about 40 to 70 keV.

13. The method of claim 1 wherein insulating spacers, possibly composed of TEOS, are applied to the sides of the gate electrode of said MOSFET.

14. The method of claim 1 wherein a second donor implant is self aligned to spacers applied to the sides of the gate electrode of said MOSFET, and could be arsenic ions implanted to a dose of about 1E15 to 5E15 per cm2 at energy of about 35 to 65 keV.

15. The method of claim 1 wherein the width of the source/drain regions is about 0.35 to 1.0 micrometers.

16. The method of claim 1 wherein the overlap of a source/drain region and the said overlap part of the n-type photodiode region is between about 0.44 to 0.66 micrometers.

17. The method of claim 1 wherein said blanket insulating layer is composed of TEOS, BPTEOS or PEoxide.

18. A method of forming an image sensor comprising:
providing a partially processed semiconductor wafer containing a n-type region;
forming an p-type photodiode region within said n-type region, where said p-type photodiode region is formed singly, separately, independently and before the formation of isolation, gate, and source/drain regions;
forming a field oxide isolation region which extends beyond said n-type region and covers said n-type region except for an active region and an overlap part of said p-pe photodiode region, which will overlap a source/drain region of a p-channel MOSFET;
forming a p-channel MOSFET in said active region, said n-channel MOSFET containing a gate electrode, a gate oxide layer and source/drain regions, with one of the source/drain regions of said MOSFET extending over said overlap part of said p-type photodiode region;
depositing a blanket transparent insulating layer.

19. The method of claim 18 wherein said n-type region is an n-well or an n-type substrate.

20. The method of claim 18 wherein said p-type photodiode region is formed by ion implantation of acceptor ions.

21. The method of claim 18 wherein the dimensions of the surface area of said p-type photodiode region is about 3.5 micrometers by 4.5 micrometers.

22. The method of claim 18 wherein said p-type photodiode region is formed by implantation of boron, fluorine or BF2 ions.

23. The method of claim 18 wherein said p-type photodiode region is formed by implantation of boron to a dose of about 1E13 to about 5E15 per cm2 and an energy of about 40 to about 120 keV.

24. The method of claim 18 wherein said field oxide isolation region is formed by thermal oxidation.

25. The method of claim 18 wherein said field oxide isolation region is formed using the LOCOS process or the poly-buffered LOCOS process.

26. The method of claim 18 wherein the field oxide of said field oxide isolation region is grown to a thickness of about 500 to about 900 nm at a temperature of between about 900 to about 1000 degrees (C.).

27. The method of claim 18 wherein the gate electrode of said MOSFET is composed of polysilicon or polycide.

28. The method of claim 18 wherein the gate electrode of said MOSFET is between about 0.35 to 1.0 micrometers wide.

29. The method of claim 18 wherein a first acceptor implant is self-aligned to the gate electrode of said MOSFET and could be BF2 ions implanted to a dose of about 8E12 to 5E13 at energy of about 30 to 50 keV.

30. The method of claim 18 wherein insulating spacers, possibly composed of TEOS, are applied to the sides of the gate electrode of said MOSFET.

31. The method of claim 18 wherein a second donor implant is self aligned to spacers applied to the sides of the gate electrode of said MOSFET, and could be BF2 ions implanted to a dose of about 1E15 to 5E15 per cm2 at energy of about 30 to 50 keV.

32. The method of claim 18 wherein the width of the source/drain regions is about 0.35 to 1.0 micrometers.

33. The method of claim 18 wherein the overlap of a source/drain region and the said overlap part of the p-type photodiode region is about 0.54 to 0.66 micrometers.

34. The method of claim 18 wherein said blanket insulating layer is composed of TEOS, BPTEOS or PEoxide.

* * * * *